(12) United States Patent
Aitken et al.

(10) Patent No.: US 8,206,804 B2
(45) Date of Patent: Jun. 26, 2012

(54) PHASE CHANGE MEMORY MATERIALS

(75) Inventors: Bruce Gardiner Aitken, Corning, NY (US); Charlene Marie Smith, Corning, NY (US)

(73) Assignee: Corning Incorporated, Corning, NY (US)

( * ) Notice: Subject to any disclaimer, the term of this patent is extended or adjusted under 35 U.S.C. 154(b) by 386 days.

(21) Appl. No.: 12/503,156

(22) Filed: Jul. 15, 2009

(65) Prior Publication Data
US 2010/0055493 A1 Mar. 4, 2010

Related U.S. Application Data

(60) Provisional application No. 61/092,868, filed on Aug. 29, 2008.

(51) Int. Cl.
*B32B 3/02* (2006.01)

(52) U.S. Cl. .............. 428/64.1; 428/64.4; 430/270.13

(58) Field of Classification Search ............ 428/64.4; 430/270.13
See application file for complete search history.

(56) References Cited

U.S. PATENT DOCUMENTS

| | | | | |
|---|---|---|---|---|
| 6,930,913 | B2 | 8/2005 | Pellizzer et al. | 365/163 |
| 7,632,456 | B2 * | 12/2009 | Cheong et al. | 420/576 |
| 2004/0053166 | A1 * | 3/2004 | Shingai et al. | 430/270.13 |
| 2008/0145702 | A1 * | 6/2008 | Shin et al. | 428/698 |

OTHER PUBLICATIONS

J.A. Savage, *Glass Formation and D.S.C. Data in the Ge-Te and As-Te Memory Glass System*, Journal of Non-Crystalline Solids, vol. 11, pp. 121-130 (1972).

K. Tanaka, et al., *Kinetics of Growth of Conductive Filament in As-Te-Ge Glasses*, Journal of Non-Crystalline Solids, vol. 12, pp. 100-114 (1973).
J.A. Savage, *Glass Forming Region and DTA Survey in the Ge-As-Te Memory Switching Glass System*, Journal of Materials Science, vol. 6, pp. 964-968 (1971).
Sigeru Iizima, et al. *Electrical and Thermal Properties of Semiconducting Glasses As-Te-Ge*, Solid State Communications, vol. 8 pp. 153-155 (1970).
A Hamada, et al. *Effect of Heat Treatment an Optical Property in Amorphous Semiconductors*, Solid State Communications, vol. 9, pp. 873-875 (1971).
A. Ray Hilton, et al. *New High Temperature Infrared Transmitting Glasses-III*, Infrared Physics, pp. 183-194, vol. 6, pp. 183-194 (1966).
R. Ollitrault-Fichet, et al., *Formation Et Comportement Thermique Des Verres Dans Le Systeme As-Ge-Te Relations Avec Le Diagramme De Phases—Mise en évidence d'une séparation sub-liquidus de phases vitreuses (Formation and Thermal Behaviour of Glasses of the As-Ge-Te System; Relations with the Phase Diagram)*, Mat. Res. Bull., vol. 24, pp. 351-361 (1989).
B.V. Kobrin, et al. *Effects of Copper and Lead on the Properties of As-Ge-X Glasses (X=S, Se, Te)*, Journal of Non-Crystalline Solids, vol. 89, pp. 263-272 (1987).
Noboru Yamada, et al. *Rapid-phase transitions of $GeTeSb_2Te_3$ pseudobinary amorphous thin films for an optical disk memory*, J. Appl. Phys., vol. 69 (5), pp. 2849-2856 (Mar. 1, 1991).
G.B. Aitken, et al. *The effect of Te on the physical properties of GeAsS glasses*, Journal of Non-Crystalline Solids 326&327, pp. 29-36 (2003).

(Continued)

*Primary Examiner* — Elizabeth Mulvaney
(74) *Attorney, Agent, or Firm* — Tina N. Thompson

(57) ABSTRACT

Phase change memory materials and more particularly GeAs telluride materials useful for phase change memory applications, for example, optical and electronic data storage are described.

17 Claims, 6 Drawing Sheets

OTHER PUBLICATIONS

M. Wuttig, et al., *Phase-change materials for rewriteable data storage*, Nature Materials, vol. 6, Nov. 2007, pp. 824-833.

S. Jaulmes, et al., *Structure of diarsenic pentagermanium*, Acta Cryst., C43 (1987), 2268 (English Translation).

H. Shu, et al. *III. Crystallographic study of a family of compounds with common structural models: $\beta$-$As_2Te_3$, $As_4GeTe_7$ and $As_2Ge_nTe_{3+n}$ (n=1 to 5)*, Journal of Solid State Chemistry 74, 277-286 (1988) (English Translation).

S. Kuypers, *Electron Microscopic Study of the Homologous Series of Mixed Layer Compounds $As_2Te_3(GeTe)_n$*.

Qiao, B., et al., *Si-Sb-Te films for phase-change random access memory*, Semicond. Sci. Technol. 21 (2006) pp. 1073-1076.

Mehra, R.M., et al., *Suitability of Ge-As-Te System for optical data storage*, J. Optics (Paris), 1996, vol. 27, n° 3, pp. 139-143.

Mohamed, et al., S.H., *Structural and optical properties of Ge-As-Te thin films*, Eur. Phys. J. Appl. Phys. 34, (2006), pp. 165-171.

Choi, K., et al., *The effect of antiomny-doping on $Ge_2Sb_2Te_5$, a phase change material*, Science Direct, Thin Solid Films, 516 (2008), pp. 8810-8812.

Ormondroyd, R.F., et al., *Effect of composition and forming parameters on the conductance of amorphous chalcogenide threshold switches*, Journal of Non-Crystalline Solids 18 (1975) pp. 375-393.

Ormondroyd, R.F., et al., *Properties of filaments in amorphous chalcogenide semiconducting threshold switches*, Journal of Non-Crystalline Solids, 15 (1974), pp. 310-328.

\* cited by examiner

PHASE CHANGE MEMORY MATERIALS

This patent application claims the benefit of priority to U.S. Provisional Patent Application 61/092,868 filed on Aug. 29, 2008.

BACKGROUND

1. Field

Embodiments of the invention relate to phase change memory materials and more particularly to GeAs telluride materials useful for phase change memory applications, for example, optical and electronic data storage.

2. Technical Background

Conventional phase change memory devices utilize materials which can change between two phases having distinct properties. The materials, typically, can change from an amorphous phase to a crystalline phase, and the phases can have considerably different properties, for example, different resistivities, conductivities, and/or reflectivities.

Phase change from an amorphous phase to a crystalline phase can be achieved through heating the amorphous material to a temperature which promotes nucleation, crystal formation, and then crystallization. The phase change back to amorphous can be achieved by heating the crystalline phase above the melting temperature.

Chalcogenide materials, for example, Ge, Sb, and Te alloys are currently used in phase change memory applications such as for storing information in over writable disks.

Several phase change memory materials identified to date have been developed by workers at Matsushita/Panasonic and IBM. Representative materials include compositions on the GeTe—$Sb_2Te_3$ join, particularly $Ge_2Sb_2Te_5$ (GST), and Au, In-doped Sb telluride (AIST). These materials can be cycled on a ~10 ns time scale between a high conductivity, high reflectivity crystalline phase and a low conductivity, low reflectivity amorphous phase under laser heating or current pulses.

Although some conventional materials such as GST and AIST have good properties for non-volatile memory applications, it would be advantageous to have phase change memory materials that have faster phase transitions and/or longer write/rewrite potential.

SUMMARY

Embodiments of the invention are GeAsTe-based compositions for phase change memory applications that lie outside of the canonical GeSbTe system. Moreover, as certain GeAsTe compositions can be made into bulk glasses, the stability of the GeAsTe amorphous phase is likely to be greater than that of the GeSbTe analogues where bulk glass formation is not possible. This feature may result in an increased number of write/rewrite cycles without degradation of conductivity/reflectivity contrast as well as longer data retention.

One embodiment of the invention is an article comprising a crystallized thin film comprising a composition having at least one hexagonal phase, or a crystallizable composition capable of having at least one hexagonal phase in a crystallized form.

Another embodiment of the invention is a method comprising providing a thin film comprising a phase change memory amorphous material, and converting the phase change memory amorphous material to a hexagonal crystalline phase.

Yet another embodiment of the invention is a method comprising providing a thin film comprising a phase change memory material having a hexagonal crystalline phase, and converting the hexagonal crystalline phase to an amorphous phase.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that both the foregoing general description and the following detailed description are merely exemplary of the invention, and are intended to provide an overview or framework for understanding the nature and character of the invention as it is claimed.

The accompanying drawings are included to provide a further understanding of the invention, and are incorporated in and constitute a part of this specification. The drawings illustrate one or more embodiment(s) of the invention and together with the description serve to explain the principles and operation of the invention.

BRIEF DESCRIPTION OF THE DRAWINGS

The invention can be understood from the following detailed description either alone or together with the accompanying drawing figures.

DETAILED DESCRIPTION

Figure 1:
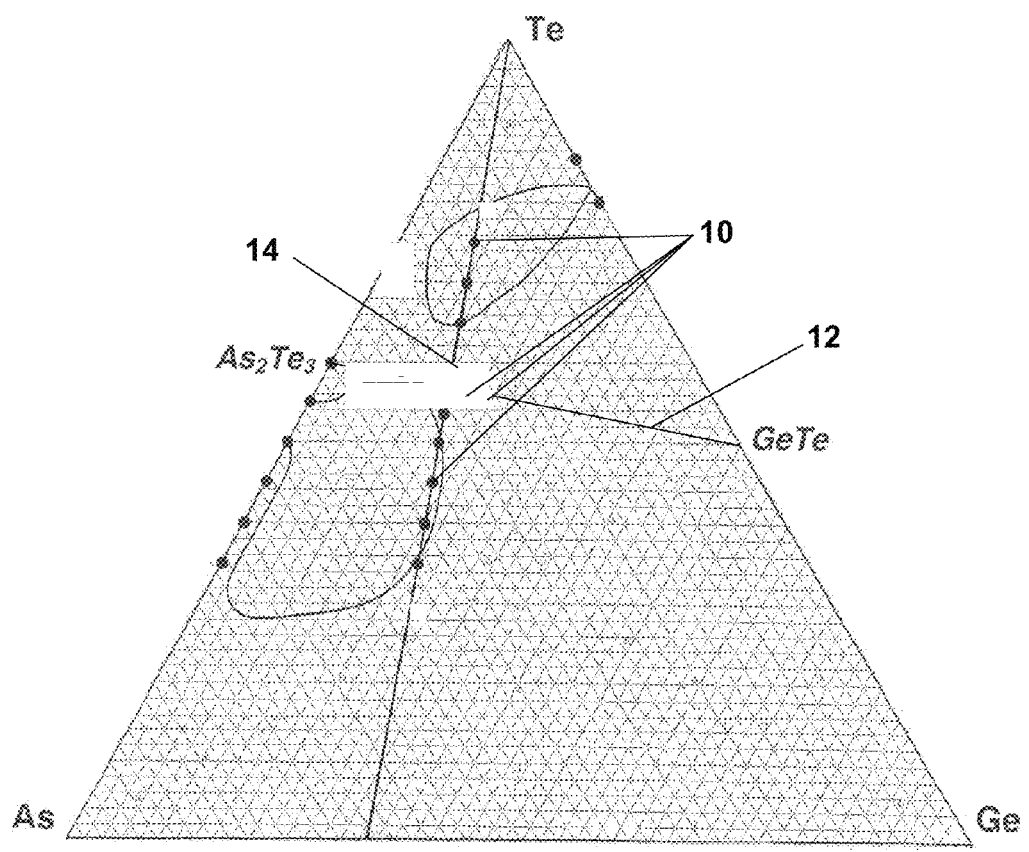
FIG. 1 is a composition diagram for GeAsTe materials.

Reference will now be made in detail to various embodiments of the invention. Wherever possible, the same reference numbers will be used throughout the drawings to refer to the same or like features.

One embodiment of the invention is an article comprising a crystallized thin film comprising a composition having at least one hexagonal phase, or a crystallizable composition capable of having at least one hexagonal phase in a crystallized form.

The composition, according to some embodiments, comprises in atomic percent:
  5 to 45 Ge;
  5 to 40 As, or a combination of As and Sb, wherein the atomic percent of As is greater than the atomic percent of Sb; and
  45 to 65 Te.

The composition, according to some embodiments, comprises in atomic percent:
  10 to 30 Ge;
  15 to 30 As, or a combination of As and Sb, wherein the atomic percent of As is greater than the atomic percent of Sb; and
  50 to 60 Te.

The composition can further comprise Al, Si, Ga, Se, In, Sn, Tl, Pb, Bi, P, S, or a combination thereof. The atomic percent of the Al, Si, Ga, Se, In, Sn, Tl, Pb, Bi, P, S, or a combination thereof is 20 percent or less, in some embodiments. The atomic percent of the Al, Si, Ga, Se, In, Sn, Tl, Pb, Bi, P, S, or a combination thereof is 15 percent or less, in some embodiments.

According to one embodiment, the thin film is disposed on a substrate. The thin film can be deposited on a substrate, according to one embodiment. The substrate comprises a glass, a glass ceramic, a ceramic, a polymer, a metal, or combinations thereof, in some embodiments.

GeAsTe glasses and their crystalline analogues have the potential of being phase change materials characterized by a glassy state that can be more stable than that of conventional phase change materials such as GST and AIST. A wide range of GeAsTe glasses, according to the invention, can transform to a more reflective crystalline phase upon heating than the above described conventional materials. For glasses on the Te—GeAs$_2$ join, this phenomenon has been demonstrated for compositions containing from 45 to 65 atomic percent Te. Many of these materials, when crystallized, consist of at least two phases: either two crystalline phases or one crystalline phase plus a residual glass phase.

Glasses with compositions on the As$_2$Te$_3$—GeTe join, however, can be crystallized to a single phase and, as such, can exhibit maximum conductivity/reflectivity contrast between the glassy and crystalline state. Such glasses can be doped with constituents compatible with the crystalline phase, such as Al, Si, Ga, Se, In, Sn, Tl, Pb, Bi, P, S, or a combination thereof without forming a second phase in the heated state.

TABLE 1

|    | GeAs$_2$Te$_4$ | Ge$_2$As$_2$Te$_5$ | Ge$_3$As$_2$Te$_6$ | GeAs$_{1.2}$Sb$_{0.8}$Te$_4$ | GeAs$_{1.4}$Sb$_{0.6}$Te$_4$ | GeAs$_{1.9}$Bi$_{0.1}$Te$_4$ |
|----|---|---|---|---|---|---|
| Ge | 14.3 | 22.2 | 27.3 | 14.3 | 14.3 | 14.3 |
| As | 28.6 | 22.2 | 18.2 | 17.1 | 20 | 27.1 |
| Sb | — | — | — | 11.4 | 8.57 | — |
| Bi | — | — | — | — | — | 1.43 |
| Te | 57.1 | 55.6 | 54.5 | 57.1 | 57.1 | 57.1 |
| Si |   |   |   |   |   |   |
| Ga |   |   |   |   |   |   |
| In |   |   |   |   |   |   |
| P  |   |   |   |   |   |   |

TABLE 2

|    | Ge$_{0.9}$Si$_{0.1}$As$_2$Te$_4$ | Ge$_{0.9}$Ga$_{0.05}$P$_{0.05}$As$_2$Te$_4$ | Ge$_{0.9}$In$_{0.05}$P$_{0.05}$As$_2$Te$_4$ |
|----|---|---|---|
| Ge | 13.21 | 13.21 | 13.21 |
| As | 28.57 | 28.57 | 28.57 |
| Sb | — | — | — |
| Bi | — | — | — |
| Te | 57.14 | 57.14 | 57.14 |
| Si | 1.07 | — | — |
| Ga | — | 0.54 | — |
| In | — | — | 0.54 |
| P  | — | 0.54 | 0.54 |

Exemplary compositions, according to the invention, are shown in Table 1 and Table 2.

Another embodiment of the invention is a method comprising providing a thin film comprising a phase change memory amorphous material, and converting the phase change memory amorphous material to a hexagonal crystalline phase.

Phase change from an amorphous phase to a hexagonal crystalline phase can be achieved through heating the amorphous material to a temperature which promotes nucleation, crystal formation, and then crystallization.

Converting the phase change memory amorphous material to a hexagonal crystalline phase can comprise heating. Isothermal heating, for example, electrical heating using resistive and/or inductive heating; laser heating; or the like can be used to heat the thin film to induce phase change.

According to one embodiment, the phase change memory amorphous material comprises in atomic percent:
  5 to 45 Ge;
  5 to 40 As, or a combination of As and Sb, wherein the atomic percent of As is greater than the atomic percent of Sb; and
  45 to 65 Te.

The phase change memory amorphous material, according to some embodiments, comprises in atomic percent:
  10 to 30 Ge;
  15 to 30 As, or a combination of As and Sb, wherein the atomic percent of As is greater than the atomic percent of Sb; and
  50 to 60 Te.

The phase change memory amorphous material can further comprise Al, Si, Ga, Se, In, Sn, Tl, Pb, Bi, P, S, or a combination thereof. The atomic percent of the Al, Si, Ga, Se, In, Sn, Tl, Pb, Bi, P, S, or a combination thereof is 20 percent or less, in some embodiments. The atomic percent of the Al, Si, Ga, Se, In, Sn, Tl, Pb, Bi, P, S, or a combination thereof can be 15 percent or less.

Yet another embodiment of the invention is a method comprising providing a thin film comprising a phase change memory material having a hexagonal crystalline phase, and converting the hexagonal crystalline phase to an amorphous phase.

This phase change to the amorphous phase can be achieved by heating the crystalline phase above the melting temperature of the phase change memory material.

In some embodiments, converting the phase change memory material having the hexagonal crystalline phase to the amorphous phase comprises heating. Isothermal heating, for example, electrical heating using resistive and/or inductive heating; laser heating; or the like can be used to heat the thin film to induce phase change.

According to some embodiments, the phase change memory material comprises in atomic percent:
  5 to 45 Ge;
  5 to 40 As, or a combination of As and Sb, wherein the atomic percent of As is greater than the atomic percent of Sb; and
  45 to 65 Te.

The phase change memory material, according to some embodiments, comprises in atomic percent:
  10 to 30 Ge;
  15 to 30 As, or a combination of As and Sb, wherein the atomic percent of As is greater than the atomic percent of Sb; and
  50 to 60 Te.

The phase change memory material can further comprise Al, Si, Ga, Se, In, Sn, Tl, Pb, Bi, P, S, or a combination thereof.

The atomic percent of the Al, Si, Ga, Se, In, Sn, Tl, Pb, Bi, P, S, or a combination thereof is 20 percent or less, in some embodiments. The atomic percent of the Al, Si, Ga, Se, In, Sn, Tl, Pb, Bi, P, S, or a combination thereof can be 15 percent or less.

Bulk GeAsTe glasses such as those indicated by the solid circles 10 in FIG. 1, can be thermally crystallized to yield a highly reflective phase or phase assemblage. In the case of glasses with compositions on the $As_2Te_3$—GeTe join 12, this phase is one of the homologous series of mixed layer compounds that can be represented by the formula: $As_2Te_3(GeTe)_n$, where n is an integer. For example, for the material represented by circle 14, with a Ge:As ratio of 1:2, this phase is $GeAs_2Te_4$, i.e. n=1. These bulk glasses can be prepared using the chalcogenide glass processing technique of ampoule melting.

For applications in solid state memory, these materials are used in thin film format. Thin films can be fabricated by a variety of techniques, for example, magnetron sputtering, thermal evaporation and pulsed laser deposition. These thin films can be deposited onto a substrate and can be utilized in phase change memory devices.

According to one embodiment, the thin films are 2 microns or less in thickness, for example, 1 micron or less, for example, 0.5 microns or less. In some embodiments, the thickness of the thin film ranges from 20 nanometers to 1 micron, for example, 40 nanometers to 1 micron, for example, 50 nanometers to 1 micron. Although specific ranges are indicated, in other embodiments, the thickness may be any numerical value within the ranges including decimals.

EXAMPLES

Using pulsed laser deposition, thin films of $GeAs_2Te_4$, in this example, $Ge_{14.3}As_{28.6}Te_{57.1}$ were deposited on Eagle XG™ glass substrates with a 248-nm excimer source and high vacuum ($10^{-6}$ Torr) deposition chamber. Ablation from the target to prepare substantially continuous thin films was done for 9000 to 36000 pulses. Portions of the thin film articles were subsequently heated at 250° C. in air for times ranging from 10 to 180 mins (the heat treatment temperature was selected so as to coincide with the peak crystallization temperature of the bulk glass as measured by differential scanning calorimetry at a 10° C./min heating rate).

Figure 2:
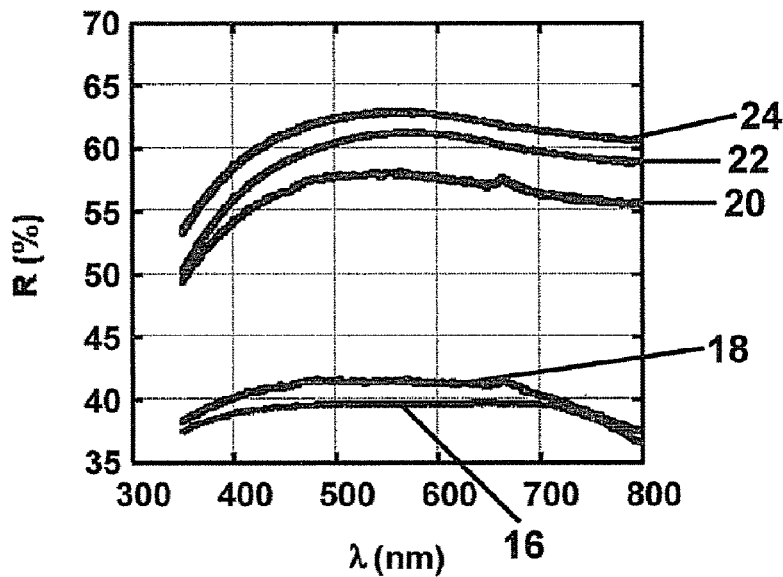
FIG. 2 is a graph of reflectivity data for a material according to one embodiment.

Visual inspection of the heated articles showed increased reflectivity. This observation was substantiated by quantitative data showing an increase in reflectivity from ~40 to ~60% at 500-700 nm as the heating time increased above 10 mins as shown in FIG. 2. Increased reflectivity was evident from the as deposited articles and those articles heated for 10 mins, shown by line 16, and line 18, respectively, to those articles heated for 30 mins, 60 mins, and 180 mins, shown by lines 20, 24, and 22, respectively.

Grazing angle X-ray diffraction confirmed that the increase in reflectivity of the samples heated for 30 mins or longer was due to crystallization of $GeAs_2Te_4$.

Figure 4:
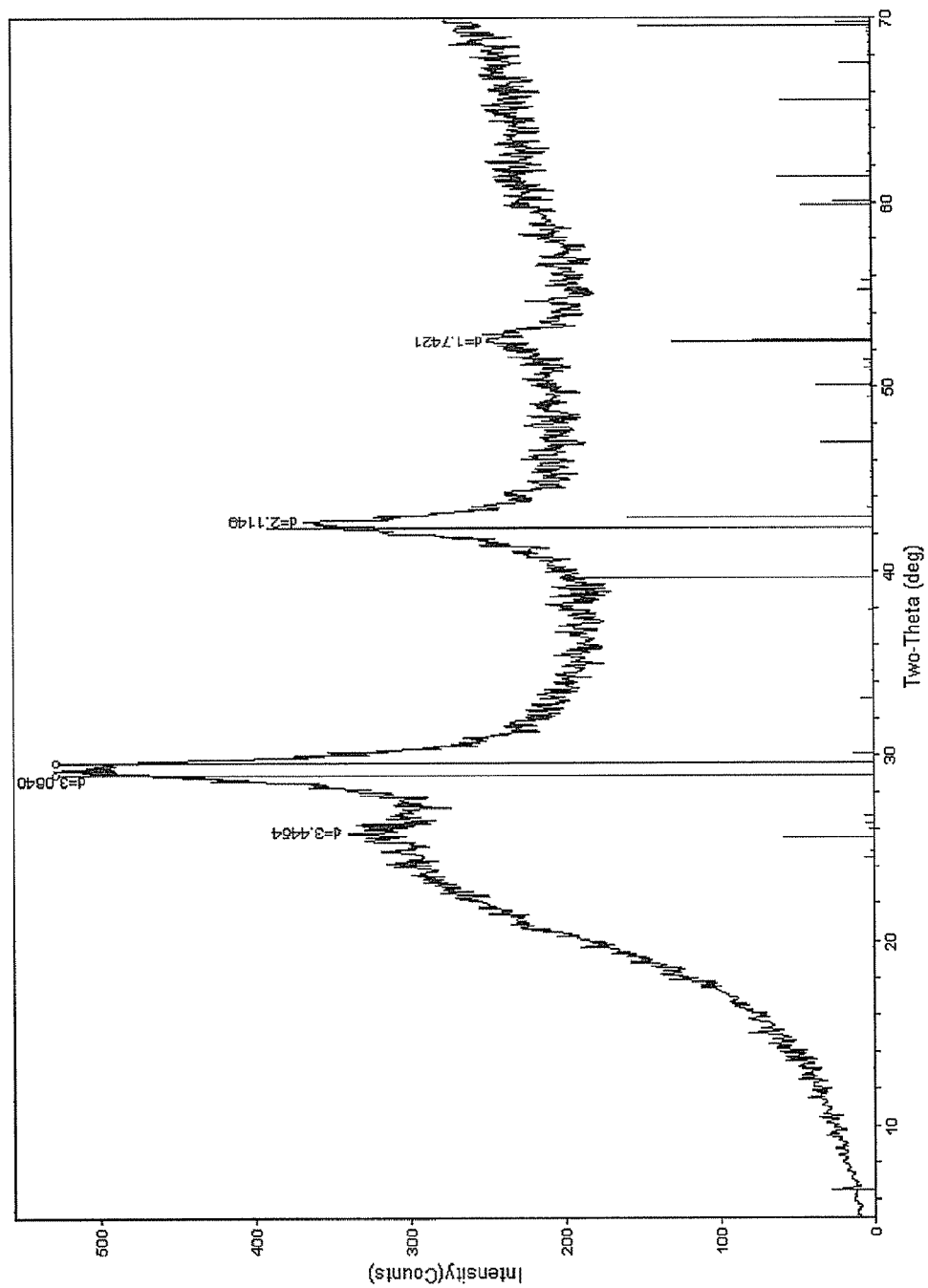
FIG. 4 and FIG. 5 are graphs of X-ray diffraction data for conventional phase change memory materials.
Figure 5:
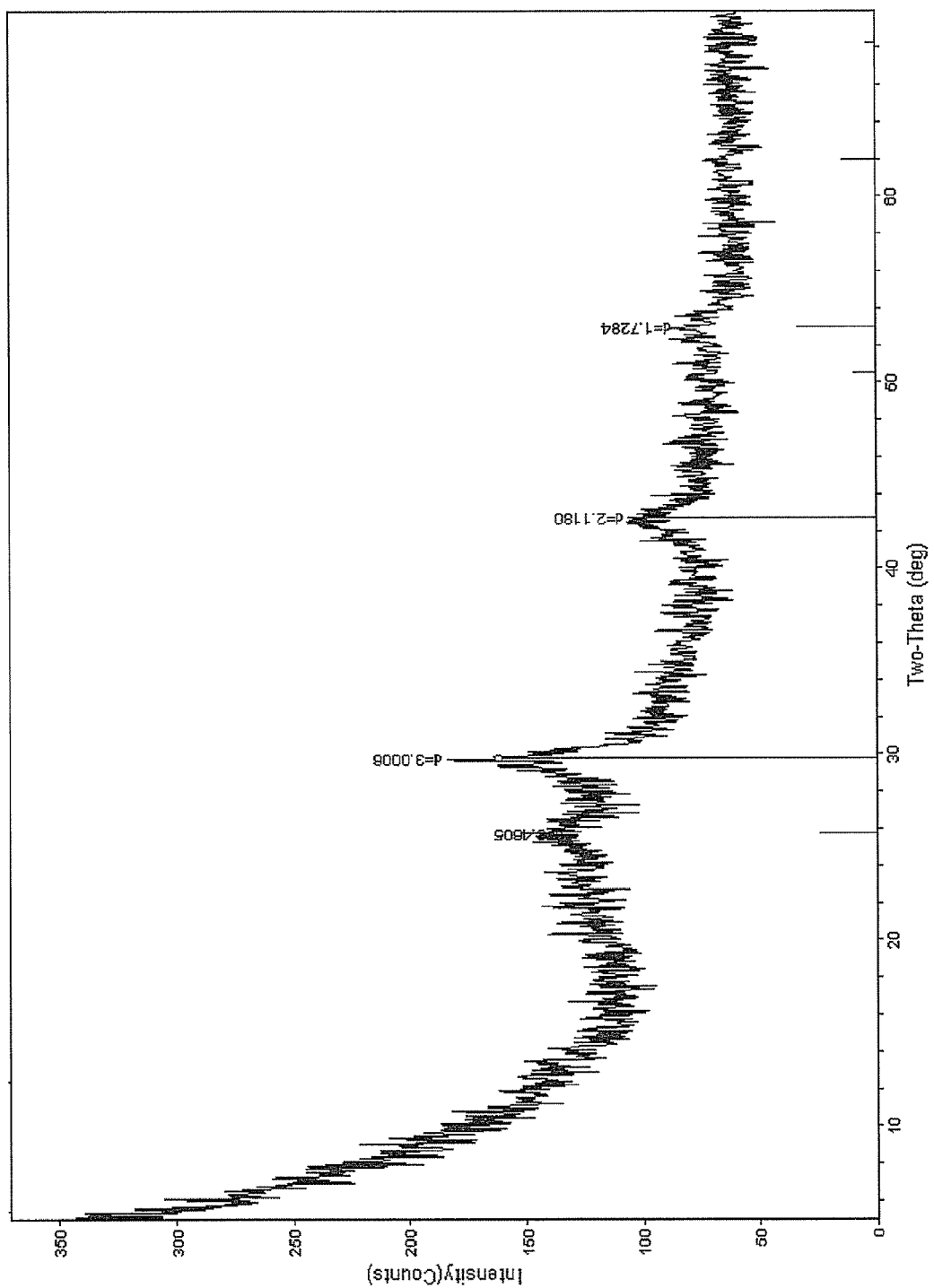

X-ray diffraction data for conventional phase change memory materials, $GeSb_2Te_4$ and $GeAsSbTe_4$, is shown in FIG. 4 and FIG. 5, respectively. The phase in the crystallized version of these films is cubic. This is deduced from the presence of only four peaks at d-spacing values near 3.5, 3.1, 2.1 and 1.7 Å; this is a diagnostic of the so-called "rocksalt" or NaCl structure.

Figure 6:
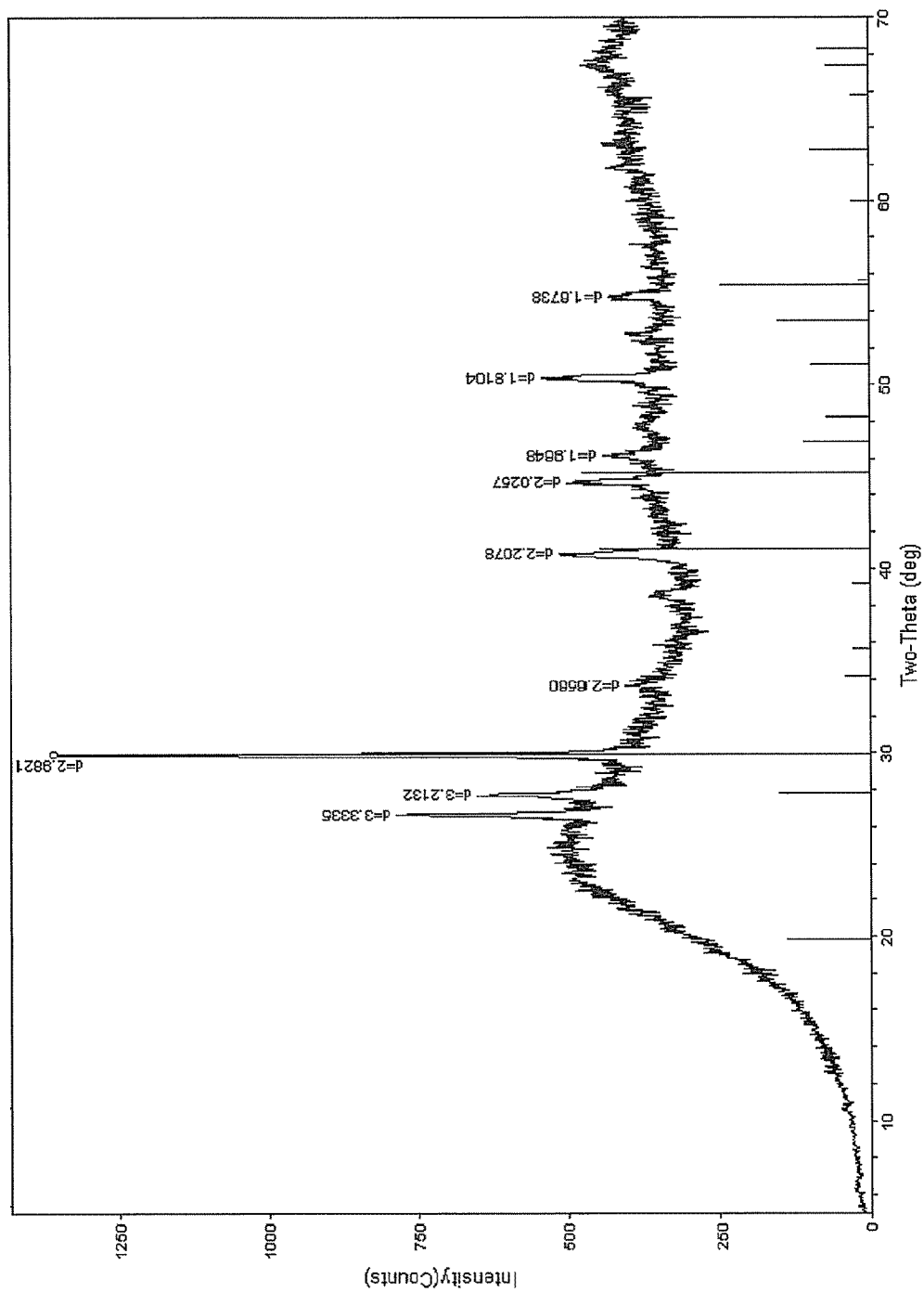
FIG. 6 and FIG. 7 are graphs of X-ray diffraction data for phase change memory materials according to the present invention.
Figure 7:
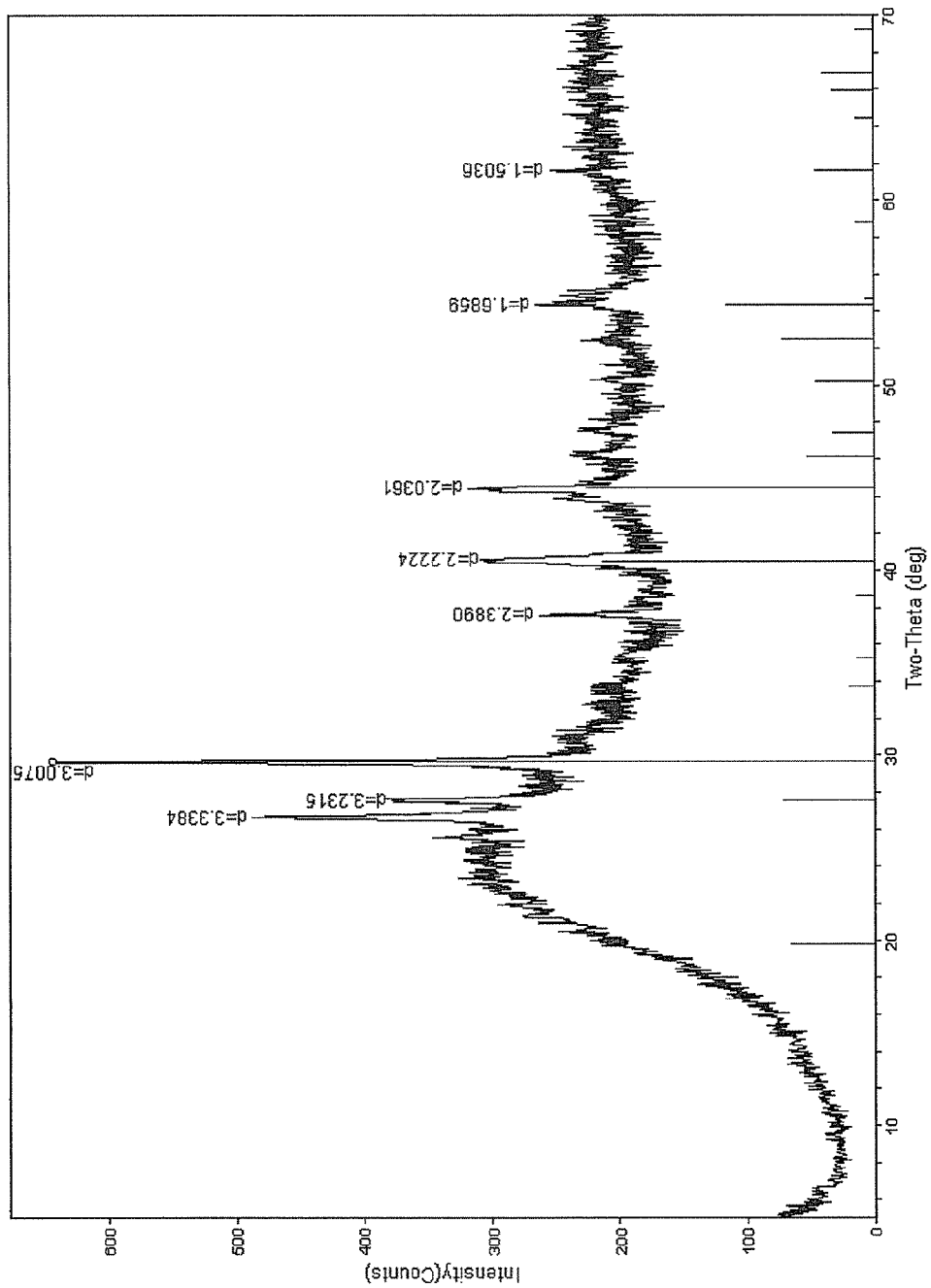

X-ray diffraction data for materials according to the present invention, $GeAs_2Te_4$ and $GeAs_{1.9}Bi_{0.1}Te_4$, is shown in FIG. 6 and FIG. 7, respectively. The increased number of peaks as compared to the cubic materials demonstrates that the materials according to the present invention comprise a hexagonal crystalline phase. X-ray diffraction data of the additional compositions shown in Table 1 were found to have peaks consistent with a hexagonal crystalline phase.

Figure 3:
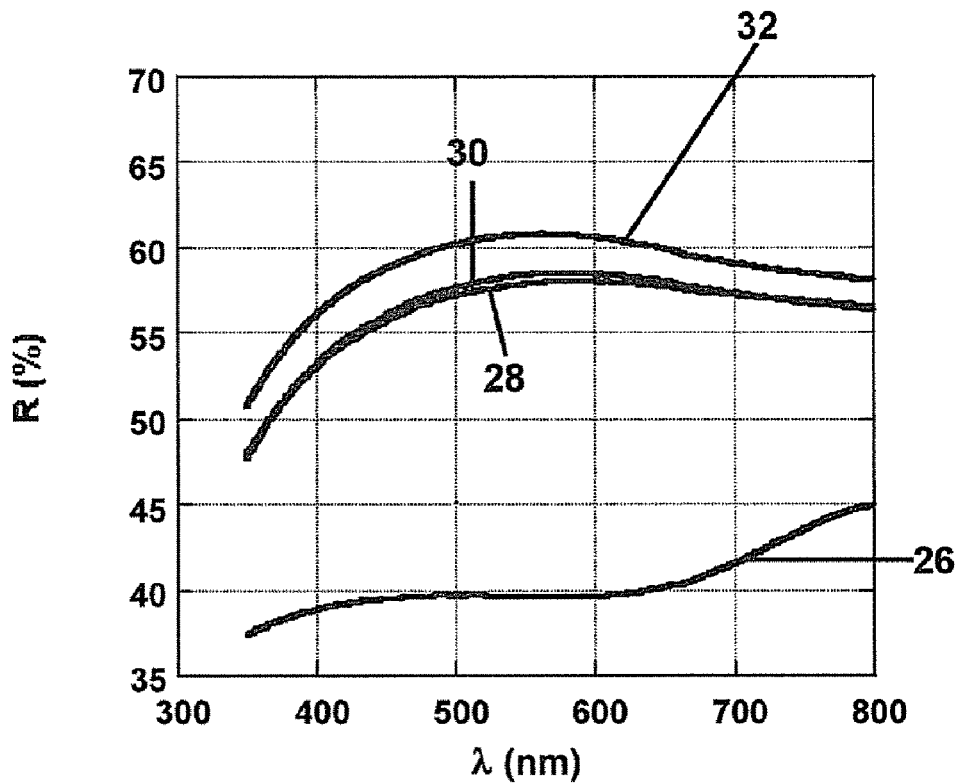
FIG. 3 is a graph of reflectivity data for a material according to one embodiment.

Additional $Ge_{14.3}As_{28.6}Te_{57.1}$ thin film articles were heated at 350° C. in air for times ranging from 1 to 10 mins. Reflectivity data for these articles is shown in FIG. 3. Increased reflectivity was evident from the as deposited articles shown by line 26 to those articles heated for 1 min, 5 mins, and 10 mins, shown by lines 28, 30, and 32, respectively.

This method was repeated for the compositions described in Table 1 and had similar results. Similar results are also expected for other thin films derived from samples with compositions on the $As_2Te_3$—GeTe join, as well as from other GeAsTe glasses within the following approximate compositional ranges in atomic percent: 5-45% Ge, 5-40% As, and 45-65% Te, and for compositions further comprising Al, Si, Ga, Se, In, Sn, Tl, Pb, Bi, P, S, or a combination thereof. These additional modifications should not degrade the phase change characteristics of these materials.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:
1. An article comprising:
    a. a crystallized thin film comprising a composition having at least one hexagonal phase; or
    b. a crystallizable composition capable of having at least one hexagonal phase in a crystallized form,
        wherein the composition comprises in atomic percent:
        5 to 45 Ge;
        5 to 40 As, or a combination of As and Sb, wherein the atomic percent of As is greater than the atomic percent of Sb;
        45 to 65 Te; and
        Al, Si, Ga, Se, In, Sn, Tl, Pb, Bi, P, S, or a combination thereof.
2. The article according to claim 1, wherein the composition comprises in atomic percent:
    10 to 30 Ge;
    15 to 30 As, or a combination of As and Sb, wherein the atomic percent of As is greater than the atomic percent of Sb; and
    50 to 60 Te.
3. The article according to claim 1, wherein the atomic percent of the Al, Si, Ga, Se, In, Sn, Tl, Pb, Bi, P, S, or combination thereof is 20 percent or less.
4. The article according to claim 3, wherein the atomic percent of the Al, Si, Ga, Se, In, Sn, Tl, Pb, Bi, P, S, or a combination thereof is 15 percent or less.
5. The article according to claim 1, wherein the thin film is disposed on a substrate.
6. The article according to claim 5, wherein the substrate comprises a glass, a glass ceramic, a ceramic, a polymer, a metal, or combinations thereof.
7. A method comprising:
    providing a thin film comprising a phase change memory amorphous material; and
    converting the phase change memory amorphous material to a hexagonal crystalline phase, wherein the phase change memory amorphous material comprises in atomic percent:
- 5 to 45 Ge;
- 5 to 40 As, or a combination of As and Sb, wherein the atomic percent of As is greater than the atomic percent of Sb;
- 45 to 65 Te; and
- Al, Si, Ga, Se, In, Sn, Tl, Pb, Bi, P, S, or a combination thereof.

8. The method according to claim 7, wherein converting the phase change memory amorphous material to a hexagonal crystalline phase comprises heating.

9. The method according to claim 7, wherein the phase change memory amorphous material comprises in atomic percent:
- 10 to 30 Ge;
- 15 to 30 As, or a combination of As and Sb, wherein the atomic percent of As is greater than the atomic percent of Sb; and
- 50 to 60 Te.

10. The method according to claim 7, wherein the atomic percent of the Al, Si, Ga, Se, In, Sn, Tl, Pb, Bi, P, S, or a combination thereof is 20 percent or less.

11. The method according to claim 7, wherein the atomic percent of the Al, Si, Ga, Se, In, Sn, Tl, Pb, Bi, P, S, or a combination thereof is 15 percent or less.

12. A method comprising:
providing a thin film comprising a phase change memory material having a hexagonal crystalline phase; and
converting the hexagonal crystalline phase to an amorphous phase, and
wherein the phase change memory amorphous material comprises in atomic percent:
- 5 to 45 Ge;
- 5 to 40 As, or a combination of As and Sb, wherein the atomic percent of As is greater than the atomic percent of Sb;
- 45 to 65 Te; and
- Al, Si, Ga, Se, In, Sn, Tl, Pb, Bi, P, 5, or a combination thereof.

13. The method according to claim 12, wherein converting the phase change memory material having the hexagonal crystalline phase to the amorphous phase comprises heating.

14. The method according to claim 12, wherein the phase change memory material comprises in atomic percent:
- 10 to 30 Ge;
- 15 to 30 As, or a combination of As and Sb, wherein the atomic percent of As is greater than the atomic percent of Sb; and
- 50 to 60 Te.

15. The method according to claim 12, wherein the atomic percent of the Al, Si, Ga, Se, In, Sn, Tl, Pb, Bi, P, S, or a combination thereof is 20 percent or less.

16. The method according to claim 15, wherein the atomic percent of the Al, Si, Ga, Se, In, Sn, Tl, Pb, Bi, P, S, or a combination thereof is 15 percent or less.

17. A phase change memory device comprising the article of claim 1.

* * * * *

UNITED STATES PATENT AND TRADEMARK OFFICE
CERTIFICATE OF CORRECTION

PATENT NO.       : 8,206,804 B2
APPLICATION NO.  : 12/503156
DATED            : June 26, 2012
INVENTOR(S)      : Bruce Gardiner Aitken et al.

It is certified that error appears in the above-identified patent and that said Letters Patent is hereby corrected as shown below:

*Col.*  *Line*
  8       10    Reads "Al, Si, Ga, Se, In, Sn, Tl, Pb, Bi, P, 5, or a combination"
                should read "Al, Si, Ga, Se, In, Sn, Tl, Pb, Bi, P, S, or a combination"

Signed and Sealed this
Thirtieth Day of October, 2012

David J. Kappos
*Director of the United States Patent and Trademark Office*